United States Patent
Chen

(10) Patent No.: US 10,910,024 B1
(45) Date of Patent: Feb. 2, 2021

(54) MEMORY DEVICE AND DATA READING METHOD THEREOF

(71) Applicant: Winbond Electronics Corp., Taichung (TW)

(72) Inventor: Chien-Lung Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/596,637

(22) Filed: Oct. 8, 2019

(51) Int. Cl.
G11C 7/00 (2006.01)
G11C 7/22 (2006.01)
G11C 7/10 (2006.01)
G11C 7/06 (2006.01)

(52) U.S. Cl.
CPC .............. *G11C 7/1069* (2013.01); *G11C 7/06* (2013.01); *G11C 7/222* (2013.01)

(58) Field of Classification Search
CPC .......... G11C 7/1069; G11C 7/06; G11C 7/222
See application file for complete search history.

(56) References Cited

U.S. PATENT DOCUMENTS

| | | | |
|---|---|---|---|
| 6,094,379 A | 7/2000 | Sago | |
| 6,373,753 B1 | 4/2002 | Proebsting | |
| 6,462,998 B1 | 10/2002 | Proebsting | |
| 7,289,354 B2 | 10/2007 | Houston | |
| 8,351,273 B2 | 1/2013 | Lee | |
| 2003/0231539 A1* | 12/2003 | Lee | G11C 7/06 365/205 |
| 2008/0123453 A1* | 5/2008 | Seo | G11C 7/22 365/205 |
| 2010/0019814 A1* | 1/2010 | Park | G11C 7/1051 327/162 |
| 2010/0085824 A1* | 4/2010 | Nagata | G11C 7/222 365/194 |
| 2015/0049563 A1* | 2/2015 | Maiti | G11C 7/22 365/194 |
| 2017/0178742 A1* | 6/2017 | Qiu | G11C 17/16 |

FOREIGN PATENT DOCUMENTS

| | | |
|---|---|---|
| TW | 200901194 | 1/2009 |
| TW | 201515007 | 4/2015 |

OTHER PUBLICATIONS

"Office Action of Taiwan Counterpart Application", dated Nov. 26, 2019, p. 1-p. 5.

\* cited by examiner

*Primary Examiner* — Toan K Le
(74) *Attorney, Agent, or Firm* — JCIPRNET

(57) ABSTRACT

A memory device includes a memory array, a sensing circuit, a delay circuit and a controller. The memory array includes a plurality of blocks. The sensing circuit reads data of a selected block of the memory array according to a sensing signal and outputs corresponding output data according to a latch signal. The delay circuit outputs the latch signal. After the sensing signal is enabled, the controller controls the delay circuit to count, to delay output of the latch signal accordingly.

11 Claims, 3 Drawing Sheets

MEMORY DEVICE AND DATA READING METHOD THEREOF

BACKGROUND

Technical Field

The disclosure relates to a technique for controlling a memory device, and particularly relates to a memory device in which output of read data is delayed by counting and a data reading method thereof.

Description of Related Art

With the advancement of electronic technologies, electronic devices have become more and more important in our daily lives. As the applications have become much more diversified, the demands on the volume and reliability of memory devices in electronic devices have also increased. In a highly integrated memory device, due to different locations of respective blocks in a memory array, the bit line lengths from the respective blocks to a sensing amplifier may also differ. If data is read before a bit line signal reaches a valid value, a reading error may occur.

To ensure data accuracy, in the conventional art, an enabling signal of the sensing amplifier may be delayed by using a delay chain. The length of the delay chain may be adjusted according to the block to be read. Accordingly, the bit line signal for transmitting data may reach the valid value before the sensing amplifier is enabled, thereby preventing a data reading error from occurring.

However, the delayed time of the bit line of each block is not necessarily linear, and the delayed time may differ due to wrapping of wires. If it is found that the range of delay which the delay chain is able to adjust does not cover all the delay times of the respective blocks to the sensing amplifier, a circuit measurement needs to be carried out again, and the structure of the delay chain needs to be modified. Such processes are both time and money-consuming.

SUMMARY

The embodiments of the disclosure provide a memory device and a reading method of the memory device capable of delaying output of data read by a sensing circuit by counting.

A memory device according to an embodiment of the disclosure includes a memory array, a sensing circuit, a delay circuit and a controller. The memory array includes a plurality of blocks. The sensing circuit is coupled to the memory array. The sensing circuit reads data of a selected block of the memory array according to a sensing signal and outputs corresponding output data according to a latch signal. The delay circuit is coupled to the sensing circuit and outputs the latch signal. The controller is coupled to the sensing circuit and the delay circuit. After the sensing signal is enabled, the controller controls the delay circuit to count to delay output of the latch signal accordingly.

According to an embodiment of the disclosure, the delay circuit includes a storage and a programmable delayer. The storage stores a delay time corresponding to each of the blocks. The programmable delayer is coupled to the storage and adopts the corresponding delay time to count according to the block information from the storage, thereby delaying the output of the latch signal.

A reading method according to an embodiment of the disclosure includes: reading data of a selected block of the memory array according to a sensing signal; counting, after enabling the sensing signal, to delay output of a latch signal; and outputting corresponding output data according to the latch signal.

Based on the above, the memory device according to the embodiments of the disclosure is capable of delaying the output of the data read by the sensing circuit by counting. Even if a test shows that the delay range does not cover all the delay times of the respective blocks to the sensing circuit, the delay range can be adjusted by setting the counting. Therefore, the adjustment process can be simplified, and the cost can be reduced.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
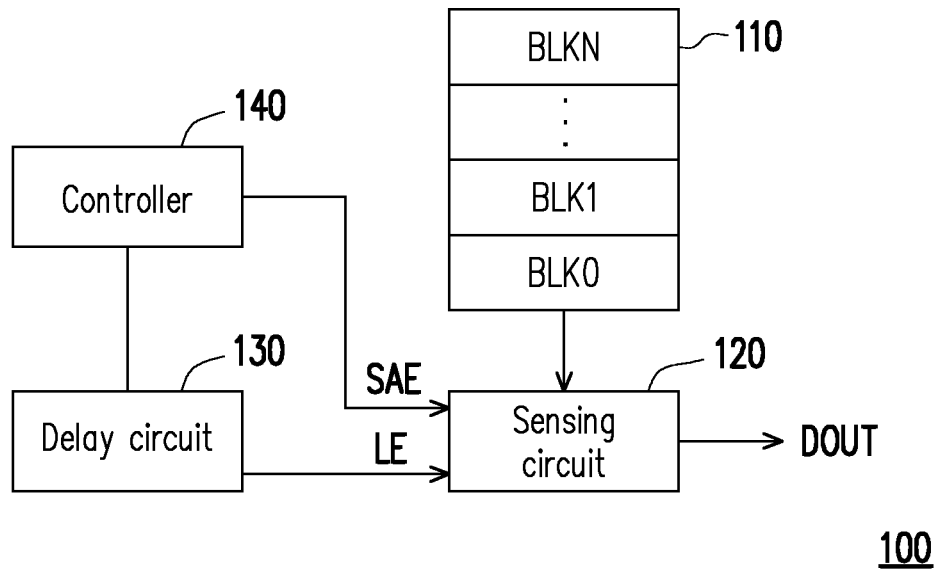
FIG. 1 is a schematic circuit diagram illustrating a memory device according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Referring to FIG. 1, FIG. 1 is a schematic circuit diagram illustrating a memory device according to an embodiment of the disclosure. A memory device 100 includes a memory array 110, a sensing circuit 120, a delay circuit 130, and a controller 140. As shown in FIG. 1, in a column direction, the memory array 110 includes N+1 blocks BLK0 to BLKN, wherein N is an integer. The blocks BLK0 to BLKN serve to store data. The memory array 110 is formed by a volatile memory device, such as a dynamic random access memory, etc., or is formed by a non-volatile memory device, such as a flash memory, a phase change memory, a resistive memory, etc. However, the embodiments of the disclosure are not limited thereto.

The sensing circuit 120 is coupled to the memory array 110. The sensing circuit 120 may read data of a selected block of the memory array 110 according to a sensing signal SAE, and output corresponding output data DOUT according to a latch signal LE.

Figure 2:
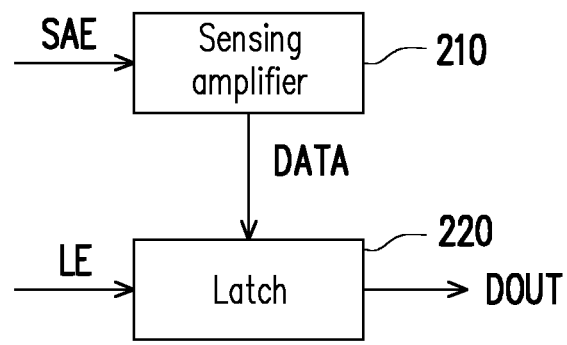
FIG. 2 is a schematic circuit diagram illustrating a sensing circuit according to an embodiment of the disclosure.

For example, FIG. 2 is a schematic circuit diagram illustrating a sensing circuit according to an embodiment of the disclosure. The sensing circuit 120 includes a sensing amplifier 210 and a latch 220. The sensing circuit 120 receives the sensing signal SAE. When the sensing signal SAE is enabled, the sensing circuit 120 may read stored data DATA in the selected block of the memory array 110 and transmit the stored data DATA to the latch 220.

The latch 220 is coupled to the sensing amplifier 210. Since there is a transmission delay between each of the blocks BLK0 to BLKN in the memory array 110 to the sensing amplifier 210, it is necessary that the latch 220 latches the stored data DATA read by the sensing amplifier 210 when receiving the latch signal LE, so as to correctly store and output the stored data DATA as output data DOUT. The hardware structure of the sensing amplifier 210 and the latch 220 may be implemented with circuit components which people having ordinary skills in the art are familiar with. The embodiments of the disclosure are not limited thereto.

Back to FIG. 1, the delay circuit 130 is coupled to the sensing circuit 120. The delay circuit 130 may output the latch signal LE. The controller 140 is coupled to the sensing circuit 120 and the delay circuit 130. In the embodiment of the disclosure, when the user intends to read data stored in the memory array 110, the controller 140 may enable the sensing signal SAE. In addition, after the sensing signal SAE is enabled, the controller 140 may control the delay circuit 130 to count to delay the output of the latch signal LE, thereby allowing the sensing circuit 120 receiving the latch signal LE to correctly output data.

The controller 130 may be a logic circuit formed by a plurality of logic gates, a central processing unit (CPU), a programmable general-purpose or specific-purpose microprocessor, a digital signal processor (DSP), a programmable controller, an application specific integrated circuit (ASIC), a programmable logic device (PLD), other similar devices, or a combination thereof. However, the embodiments of the disclosure are not limited thereto.

Figure 3:
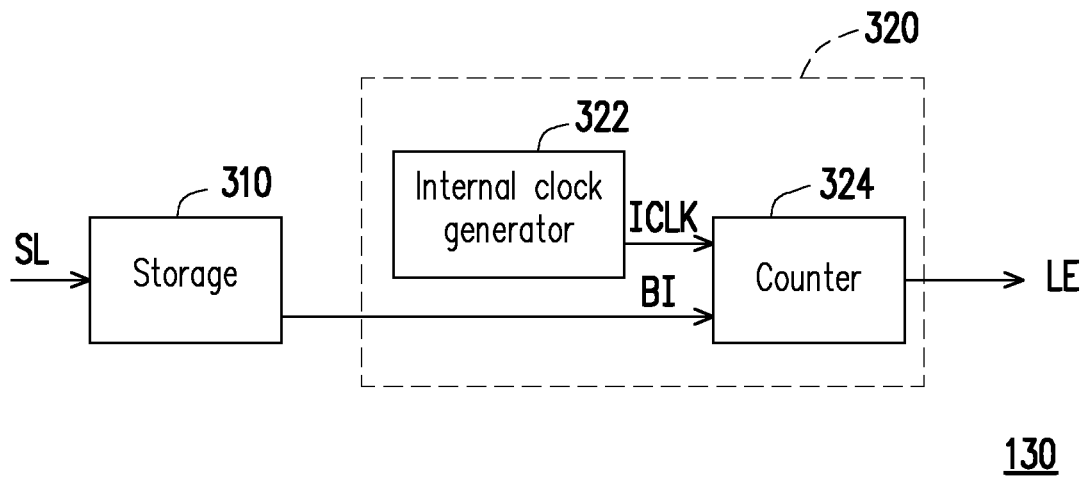
FIG. 3 is a schematic circuit diagram illustrating a delay circuit according to an embodiment of the disclosure.

In the following, an example of the structure of the delay circuit according to the embodiments of the disclosure will be described. Referring to FIG. 3, FIG. 3 is a schematic circuit diagram illustrating a delay circuit according to an embodiment of the disclosure. The delay circuit 130 includes a storage 310 and a programmable delayer 320. The storage 310 is, for example, formed by a one-time programmable (OPT) memory, such as a fuse memory, and may store the delay time corresponding to each of the blocks BLK0 to BLKN. In addition, the OPT memory such as a fuse memory may be, for example, an existing component in a circuit system formed by integrating the memory device 100 with other peripheral circuits. However, the embodiments of the disclosure are not limited thereto.

In the embodiment of the disclosure, the user may perform resistance-capacitance (RC) extraction to learn in advance and estimate the delay time range of the bit lines in the memory device 100, and may estimate the delay time of each of the blocks BLK0 to BLKN in the memory array 110 to the bit line in the sensing amplifier 210 according to a simulated RC delay model. Accordingly, the user may store the delay time corresponding to each of the blocks BLK0 to BLKN in advance in the storage 310 at the time of validating the design of the circuit.

In an embodiment, the delay time stored in the storage 310 may be, for example, a difference between the minimum delay time to the maximum delay time, so as to reduce the number of bits required for storage. For example, if the delay time of the block BLK0 is 3 nanoseconds, and the delay time of the block BLKN is 32 nanoseconds, the value corresponding the block BLK0 stored in the storage 310 is 0, and the value corresponding to the block BLKN stored in the storage 310 is 29.

The programmable delayer 320 is coupled to the storage 310. When the user intends to read the data stored in the memory array 110, the controller 140 controls, through a control signal SL, the storage 310 to provide the delay time corresponding to the selected block (equivalent to the block storing the data to be read). For example, an address decoder in the controller 140 may decode the address of the data and select the corresponding delay time in the storage 310 through the control signal SL, so as to transmit block information BI of the selected block to the programmable delayer 320. The programmable delayer 320 may adopt the delay time corresponding to the selected block to count according to the block information from the storage 310, so as to delay the output of the latch signal LE.

For example, the programmable delayer 320 includes an internal clock generator 322 and a counter 324. The internal clock generator 322 may generate an internal clock ICLK. The counter 324 is coupled to the internal clock generator 322. The counter 324 may count according to the internal clock ICLK and the block information BI, so as to output the latch signal LE at the time when a count reaches the corresponding delay time.

Besides, the memory device 100 of the embodiment has a test mode, for example. If the user wishes to adjust the range of the delay time (e.g., expanding a range from 2 nanoseconds to 5 nanoseconds to a range from 1 nanosecond to 7 nanoseconds), the user may turn the memory device 100 into the test mode to directly set the counter 324, so that the range of the delay time of the latch signal LE meets the needs. Compared with the use of a delay chain, the memory device 100 of the embodiment is more flexible in terms of the adjustment of delay time.

Figure 4:
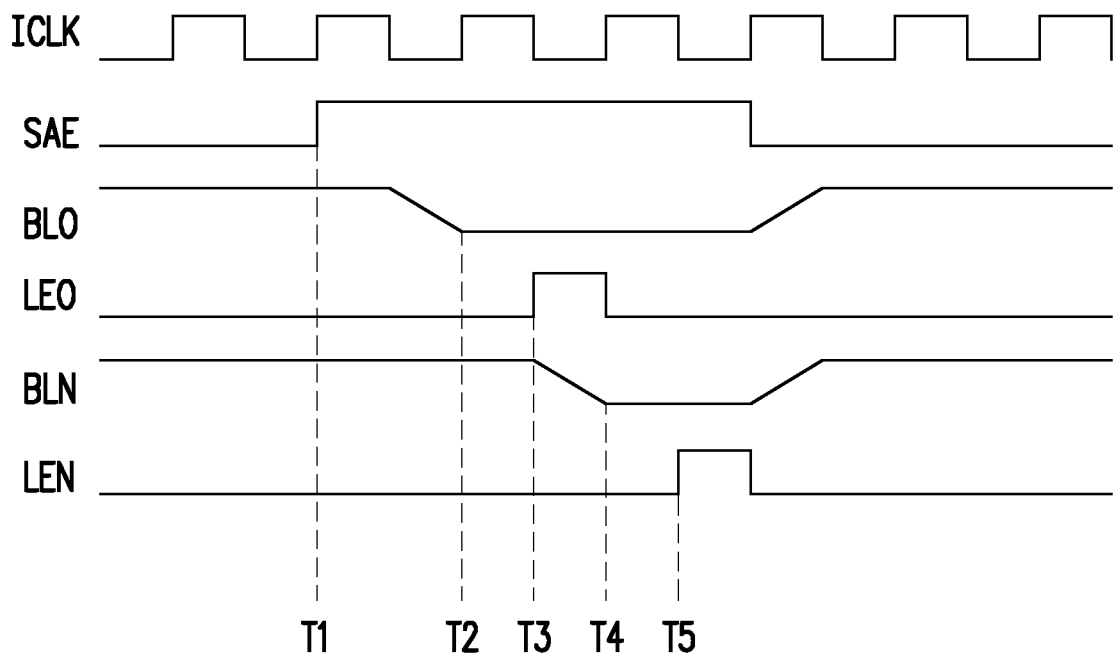
FIG. 4 is a schematic waveform of a reading operation of a memory device according to an embodiment of the disclosure.

FIG. 4 is a schematic waveform of a reading operation of a memory device according to an embodiment of the disclosure. In the following, the reading operation of the memory device 100 according to the embodiment of the disclosure is described with reference to FIGS. 1 to 4. As shown in FIG. 4, when a reading operation is to be performed (i.e., at a time point T1), the controller 140 may enable the sensing signal SAE, so that the sensing signal SAE is changed from a low logic level to a high logic level. Meanwhile, the controller 140 may control, through the control signal SL, the storage 310 to provide the delay time corresponding to the selected block, so as to transmit the block information BI of the selected block to the counter 324 in the programmable delayer 320.

Then, the counter 324 starts counting. As shown in FIG. 4, when the selected block is the block BLK0, since the distance between the block BLK0 and the sensing amplifier 210 is shorter, a bit line signal BL0 of the block BLK0 may reach the valid value earlier (i.e., at a time point T2). At this time, the delay time in the block information BI obtained by the counter 324 is also shorter. Therefore, when the count reaches the corresponding delay time (i.e., at a time point T3), the counter 324 may output a latch signal LEO (equivalent to a square wave).

Comparatively, as shown in FIG. 4, when the selected block is the block BLKN, since the distance between the block BLKN and the sensing amplifier 210 is longer, a bit line signal BLN of the block BLKN may reach the valid value later (i.e., at a time point T4). At this time, the delay time in the block information BI obtained by the counter 324 is also longer. Therefore, when the count reaches the corresponding delay time (i.e., at a time point T5), the counter 324 may output a latch signal LEN (equivalent to a square wave).

It should be noted that, regardless of at which block the data to be read is located, the enabling time point (i.e., the time point T1) of the sensing signal SAE is fixed in FIG. 4. Therefore, the memory device 100 according to the embodiments of the disclosure does not need to switch the enabling time point of the sensing signal SAE, and therefore can avoid unnecessary signal delay.

Figure 5:
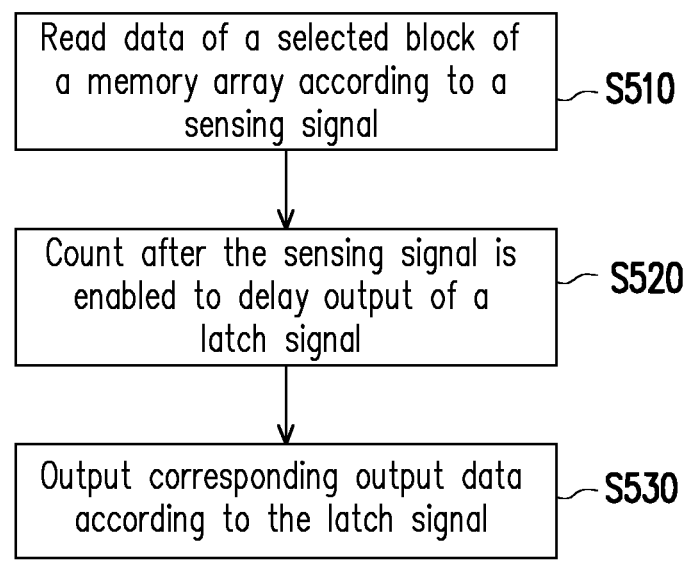
FIG. 5 is a flowchart illustrating a reading method of a memory device according to an embodiment of the disclosure.

FIG. 5 is a flowchart illustrating a reading method of a memory device according to an embodiment of the disclosure. Referring to FIG. 5, the reading method of the memory device according to the embodiment includes the following. Data of a selected block of a memory array is read according to a sensing signal (Step S510). Then, after the sensing signal is enabled, counting is performed to delay output of a latch signal (Step S520). Afterwards, corresponding output data is output according to the latch signal (Step S530). Details of Steps S510, S520, and S530 may be referred to the embodiments of FIGS. 1 to 4 and therefore will not be repeated in the following.

In view of the foregoing, in order for the bit line signal to reach the valid value before the sensing circuit outputs data, the memory device according to the embodiments of the disclosure may control the counter to count correspondingly according to the distance between each block in the memory array and the sensing circuit, so as to delay the output of the sensing circuit. Even if a test shows that the delay range does not cover all the delay times of the respective blocks to the sensing circuit, the delay range can be adjusted by setting the counter. Therefore, the adjustment process can be simplified, and the cost can be reduced.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A memory device, comprising:
a memory array, comprising a plurality of blocks;
a sensing circuit, coupled to the memory array, reading data of a selected block of the memory array according to a sensing signal, and outputting corresponding output data according to a latch signal;
a delay circuit, coupled to the sensing circuit and outputting the latch signal; and
a controller, coupled to the sensing circuit and the delay circuit, and, after the sensing signal is enabled, controlling the delay circuit to count to delay output of the latch signal.

2. The memory device as claimed in claim 1, wherein the delay circuit comprises:
a storage, storing a delay time corresponding to each of the blocks; and
a programmable delayer, coupled to the storage, and adopting the corresponding delay time to count according to block information from the storage, thereby delaying the output of the latch signal.

3. The memory device as claimed in claim 2, wherein the programmable delayer comprises:
an internal clock generator, generating an internal clock; and
a counter, coupled to the internal clock generator, and counting according to the internal clock and the block information, thereby outputting the latch signal when a count reaches the corresponding delay time.

4. The memory device as claimed in claim 2, wherein the sensing circuit comprises:
a sensing amplifier, reading stored data in the selected block of the memory array when the sensing signal is enabled; and
a latch, coupled to the sensing amplifier, and latching the stored data when receiving the latch signal, so as to output the output data.

5. The memory device as claimed in claim 4, wherein the block information stored by the storage comprises the delay time of each of the blocks in the memory array to a bit line in the sensing amplifier estimated by using a simulated resistance-capacitance (RC) delay model.

6. A reading method of a memory device, the memory device comprising a memory array having a plurality of blocks, and the reading method comprising:
reading data of a selected block of the memory array according to a sensing signal;
counting, after enabling the sensing signal, to delay output of a latch signal; and
outputting corresponding output data according to the latch signal.

7. The reading method of the memory device as claimed in claim 6, wherein a delay time corresponding to each of the blocks is stored in a storage of the memory device, and counting, after enabling the sensing signal, to delay the output of the latch signal comprises:
adopting the corresponding delay time to count according to block information from the storage, thereby delaying the output of the latch signal.

8. The reading method of the memory device as claimed in claim 7, wherein adopting the corresponding delay time to count according to the block information from the storage, thereby delaying the output of the latch signal, comprises:
counting according to an internal clock and the block information, so as to output the latch signal when a count reaches the corresponding delay time.

9. The reading method of the memory device as claimed in claim 7, wherein the block information stored by the storage comprises the delay time of each of the blocks in the memory array to a bit line in a sensing amplifier for reading the memory array, and the delay time is estimated by using a simulated resistance-capacitance (RC) delay model.

10. The reading method of the memory device as claimed in claim 6, wherein reading the data of the selected block of the memory array according to the sensing signal comprises:
reading stored data in the selected block of the memory array when the sensing signal is enabled.

11. The reading method of the memory device as claimed in claim 10, wherein outputting the corresponding stored data according to the latch signal comprises:
latching the stored data when receiving the latch signal, so as to output the output data.

* * * * *